United States Patent
Barr et al.

(10) Patent No.: US 12,376,272 B2
(45) Date of Patent: Jul. 29, 2025

(54) CABLE ASSEMBLY WITH CROSSTALK BARRIER

(71) Applicant: 3M INNOVATIVE PROPERTIES COMPANY, St. Paul, MN (US)

(72) Inventors: Alexander W. Barr, Austin, TX (US); Dennis L. Doye, Cedar Park, TX (US); John D. Geissinger, Austin, TX (US); Joseph N. Castiglione, Cedar Park, TX (US); Thomas Suniga, Austin, TX (US); Mark M. Lettang, Cedar Park, TX (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 18/688,905

(22) PCT Filed: Sep. 6, 2022

(86) PCT No.: PCT/IB2022/058365
§ 371 (c)(1),
(2) Date: Mar. 4, 2024

(87) PCT Pub. No.: WO2023/037238
PCT Pub. Date: Mar. 16, 2023

(65) Prior Publication Data
US 2024/0373609 A1   Nov. 7, 2024

Related U.S. Application Data

(60) Provisional application No. 63/242,176, filed on Sep. 9, 2021.

(51) Int. Cl.
*H05K 9/00* (2006.01)
*H01B 9/02* (2006.01)
*H05K 1/02* (2006.01)

(52) U.S. Cl.
CPC .............. *H05K 9/0098* (2013.01); *H01B 9/02* (2013.01); *H05K 1/0215* (2013.01); *H05K 2201/0707* (2013.01)

(58) Field of Classification Search
CPC ....... H05K 9/0098; H05K 2201/10356; H05K 2201/10371
See application file for complete search history.

(56) References Cited

U.S. PATENT DOCUMENTS 10,964,448 B1 * 3/2021 Wright .................. H01B 3/421
2009/0283318 A1 * 11/2009 Bonga .................. H05K 9/0026
361/818

(Continued)

FOREIGN PATENT DOCUMENTS

WO   2021144726 A1   7/2021

OTHER PUBLICATIONS

International Search report for PCT International Application No. PCT/IB2022/058365, mailed on Dec. 27, 2022, 4 pages.

*Primary Examiner* — Hung V Ngo
(74) *Attorney, Agent, or Firm* — Jonathan L. Tolstedt (57) ABSTRACT

A cable assembly is disclosed. The cable assembly includes a printed circuit board (PCB) including a plurality of alternating ground pads and groups of signal pads, and a cable comprising a plurality of spaced apart differential pairs. Each differential pair defines a stripped section and an unstripped section, and the stripped sections terminate at corresponding signal pads of a corresponding group of signal pads of the PCB. An electrically conductive shield includes a cover portion disposed on and covering at least a portion of the unstripped sections of the insulated conductors and a plurality of spaced apart walls. Each wall is disposed between the stripped sections of the insulated conductors of two adjacent differential pairs and extending from the cover portion to, and making electrical contact (Continued)

with, a corresponding ground pad disposed between the groups of signal pads corresponding to the adjacent differential pairs.

23 Claims, 8 Drawing Sheets

(56) References Cited

U.S. PATENT DOCUMENTS

| | | |
|---|---|---|
| 2013/0092429 A1 | 4/2013 | Ellison |
| 2013/0280955 A1* | 10/2013 | Alden, III ............ H01R 9/0515 |
| | | 361/748 |
| 2016/0276759 A1* | 9/2016 | Tran ................... H01R 13/6592 |
| 2016/0351298 A1* | 12/2016 | Gundel ................ H05K 9/0064 |
| 2017/0164498 A1* | 6/2017 | Song ..................... H05K 1/181 |
| 2019/0008033 A1* | 1/2019 | Chung .................. H05K 1/118 |
| 2019/0296465 A1 | 9/2019 | Vana, Jr. et al. |
| 2021/0134484 A1 | 5/2021 | Gundel et al. |
| 2021/0217541 A1 | 7/2021 | Sullivan et al. |
| 2023/0066194 A1* | 3/2023 | Kobayashi ........... H05K 9/0084 |
| 2024/0021343 A1* | 1/2024 | Lee ....................... H05K 9/0098 |
| 2024/0049394 A1* | 2/2024 | Morgan ............. H01R 12/7082 |

\* cited by examiner

FIG. 10

CABLE ASSEMBLY WITH CROSSTALK BARRIER

CROSS REFERENCE TO RELATED APPLICATIONS

This application is a national stage filing under 35 U.S.C. 371 of PCT/IB2022/058365, filed Sep. 6, 2022, which claims the benefit of U.S. Provisional Application No. 63/242,176, filed Sep. 9, 2021, the disclosures of which are incorporated by reference in their entireties herein.

BACKGROUND

Cable assemblies and cables can have a plurality of electrical conductors, sometimes in close proximity to one another. To reduce crosstalk between these elements, barriers or walls can be disposed between the electrical conductors to improve system performance. Improved barriers and walls offer enhanced performance over current technologies.

SUMMARY

In some aspects of the present disclosure, a cable assembly is disclosed. The cable assembly can include a printed circuit board (PCB) comprising a plurality of alternating ground pads and groups of signal pads, and a cable comprising a plurality of spaced apart differential pairs extending along a length (x-axis) of the cable and arranged along a width (y-axis) of the cable. Each differential pair can be surrounded by one or more electrically conductive layers and can include a plurality of insulated conductors. Each insulated conductor can comprise a conductor surrounded by an insulating material, the insulating material can be stripped between an insulation-end location on the insulated conductor and a free end of the insulated conductor to form a stripped section next to an unstripped section, and the stripped sections of the insulated conductors of each differential pair can terminate at corresponding signal pads of a corresponding group of signal pads of the PCB. An electrically conductive shield can include a cover portion disposed on and covering at least a portion of the unstripped sections of the insulated conductors, and a plurality of spaced apart walls. Each wall can be disposed between the stripped sections of the insulated conductors of two adjacent differential pairs and can extend from the cover portion to, and make electrical contact with, a corresponding ground pad disposed between the groups of signal pads corresponding to the adjacent differential pairs.

In some aspects of the present disclosure, an electrically conductive unitary shield is disclosed. The electrically conductive unitary shield can reduce crosstalk between adjacent differential pairs of a cable. The electrically conductive unitary shield can include a cover portion generally lying in a first plane (xy-plane, or FP), and a row of alternating walls and through-openings. Each wall can be oriented substantially perpendicular (xz-plane) to the first plane, each through opening can include a closed circumference and can extend between opposing first and second major surfaces of the unitary shield such that when stripped ends of insulated conductors of a differential pair of a cable, the differential pair substantially surrounded by an electrically conductive first shield, are terminated at conductive signal pads of a printed circuit board, the signal pads can be disposed between opposing conducting ground pads, the unitary shield can be assembled to the cable and the substrate. The cover portion of the unitary shield can closely cover the cable so as to capacitively couple to the first shield of the differential pair, and a pair of adjacent walls can make physical and electrical contact with the opposing ground pads so that the terminated stripped ends of the insulated conductors are exposed through the through-opening disposed between the pair of adjacent walls.

In some aspects of the present disclosure, a cable assembly is disclosed. The cable assembly can include a printed circuit board (PCB) comprising a plurality of alternating ground pads and groups of signal pads, and a cable comprising a plurality of spaced apart differential pairs extending along a length (x-axis) of the cable and arranged along a width (y-axis) of the cable. Each differential pair can be surrounded by one or more electrically conductive layers and can comprise a plurality of insulated conductors. Each insulated conductor can include a conductor surrounded by an insulating material, the insulating material can be stripped between an insulation-end location on the insulated conductor and a free end of the insulated conductor to form a stripped section next to an unstripped section, and the stripped sections of the insulated conductors of each differential pair can terminate at corresponding signal pads of a corresponding group of signal pads of the PCB. A plurality of drain wires can extend along the X-axis, and each drain wire can make electrical contact with a corresponding ground pad. An electrically conductive shield can include a cover portion disposed above at least a portion of the printed circuit board as measured along a Z-axis, and a plurality of spaced apart walls. Each wall can be disposed between the stripped sections of the insulated conductors of two adjacent differential pairs and can extend from the cover portion to, and make electrical contact with, a corresponding drain wire disposed between the groups of signal pads corresponding to the adjacent differential pairs.

DETAILED DESCRIPTION

In the following description, reference is made to the accompanying drawings that form a part hereof and in which various embodiments are shown by way of illustration. The drawings are not necessarily to scale. It is to be understood that other embodiments are contemplated and may be made without departing from the scope or spirit of the present description. The following detailed description, therefore, is not to be taken in a limiting sense.

All scientific and technical terms used herein have meanings commonly used in the art unless otherwise specified. The definitions provided herein are to facilitate understanding of certain terms used frequently herein and are not meant to limit the scope of the present disclosure. Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "lower," "upper," "beneath," "below," "above," and "on top," if used herein, are utilized for ease of description to describe spatial relationships of an element(s) to another. Such spatially related terms encompass different orientations of the device in use or operation in addition to the particular orientations depicted in the figures and described herein. For example, if an object depicted in the figures is turned over or flipped over, portions previously described as below or beneath other elements would then be above those other elements.

As used herein, when an element, component or layer for example is described as forming a "coincident interface" with, or being "on" "connected to," "coupled with" or "in contact with" another element, component, or layer, it can be directly on, directly connected to, directly coupled with, in direct contact with, or intervening elements, components or layers may be on, connected, coupled or in contact with the particular element, component or layer, for example. When an element, component or layer for example is referred to as being "directly on," "directly connected to," "directly coupled with," or "directly in contact with" another element, there are no intervening elements, components, or layers for example.

As used herein, "have", "having", "include", "including", "comprise", "comprising" or the like are used in their open-ended sense, and generally mean "including, but not limited to." It will be understood that the terms "consisting of" and "consisting essentially of" are subsumed in the term "comprising," and the like.

As standards for data communications continue to evolve and data rates of individual channels have pushed to 28 Gb/s, 56 Gb/s, and 112 Gb/s protocols, maintaining acceptable signal-to-noise margins in these channels becomes ever more challenging. For traditional passive cable assemblies used inside computer servers or between racks of servers and switches in a data center, these challenges can include minimizing the reflections and losses a signal experiences traveling down its channel, or conductor, along with suppressing unwanted noise (crosstalk) picked up from neighboring channels. For standards supporting up to 32 Gb/s signaling inside servers & switches and greater than 100 Gb/s signaling between rack mounted equipment, crosstalk between adjacent channels can have an allowed maximum of −40 dB, to ensure adequate signal-to-noise ratios. Under these parameters, even structures like cable attachments to PCBs can produce enough crosstalk be problematic.

In addition, to reducing component costs and managing ever-increasing amounts of data in limited data center footprints, it is desirable to package components and equipment in the smallest and most basic system possible. Required additional drain wires used to connect the shield to the ground on PCBs impacts packaging density and cable cost without offering independent benefits. The present disclosure provides opportunities to simultaneously reduce the costs of cable assemblies and increase the density of cables therein, and also reduce or remove the need for drain wires to connect the shield to the PCB ground.

The present disclosure provides embodiments that elevate electrical signal integrity performance of cable assemblies by reducing crosstalk between signal pairs in existing cables that lack drain wires (or have reduced numbers and/or sizes of drain wires) between the pairs, and also between signal pairs in cables having drain wires. This functionality can enable these assemblies to meet or exceed crosstalk specifications for the PCIe Gen 5 protocol or the Channel Operating Margin (COM) metric used for evaluating acceptable electrical performance in 800G Ethernet assemblies (IEEE 802.3ck).

Additionally, the present disclosure provides for fabricating high-speed cable assemblies with cables lacking drain wires (or having reduced sizes and/or numbers of drain wires), which can introduce cable design opportunities with different functional benefits. When remaining signal pairs in the cable are moved closer together, narrower, lighter, and less expensive cables can be fabricated. Such reduced cable size can enable a higher packaging density within equipment or racks in the data center. Further, if a cable width is kept constant and the drain wires are removed (or reduced in size and/or number), the spacing of the signal pairs can be re-adjusted over a same overall width dimension to allow the closest pairs to be spaced further apart, thus further improving the crosstalk performance of the cable terminations of the previously closest pairs. Embodiments disclosed herein can be used in any application that attaches high bandwidth cable to a PCB, or can be used in OSFP, PCIe Gen 5 Extenders, Gen Z, MCIO, and Low Profile SlimSAS cables. The walls, signal pads, ground pads, shield, cover portion, front wall, and cable assemblies as described herein enable and facilitate such functionality improvements.

Figure 1:
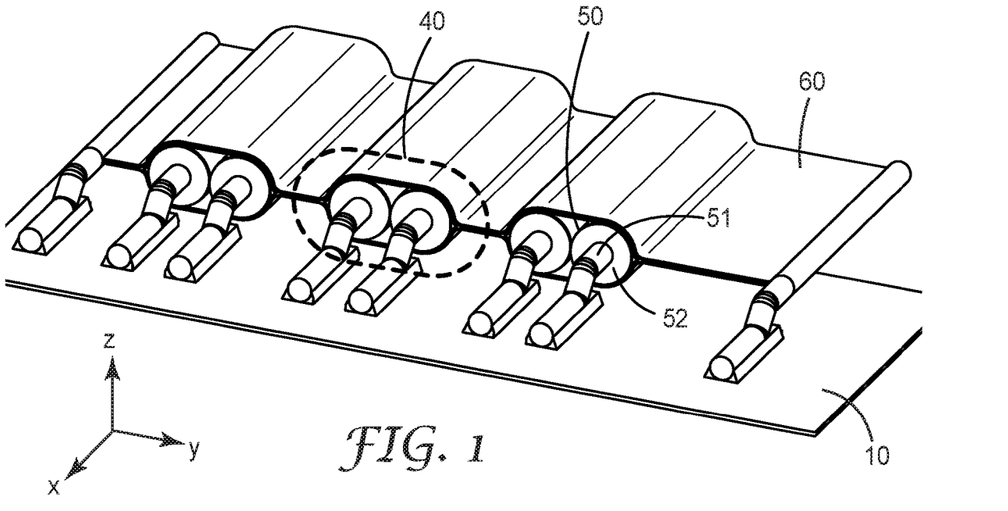
FIG. 1 is an upper perspective view of a Printed Circuit Board (PCB) and differential pairs, according to exemplary embodiments of the present disclosure.
Figure 2:
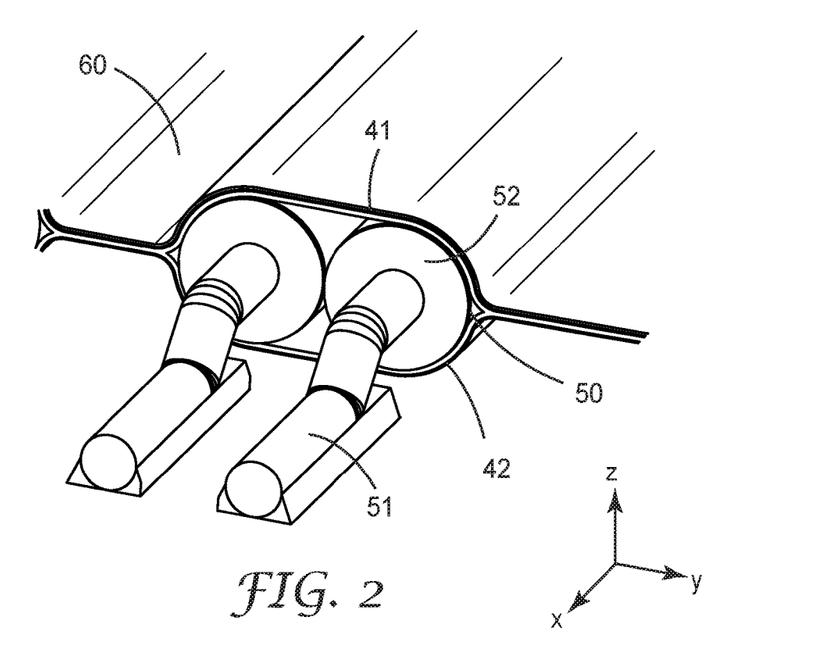
FIG. 2 is an upper perspective view of a PCB and differential pairs, similar to those of FIG. 1, according to exemplary embodiments of the present disclosure.
Figure 3:
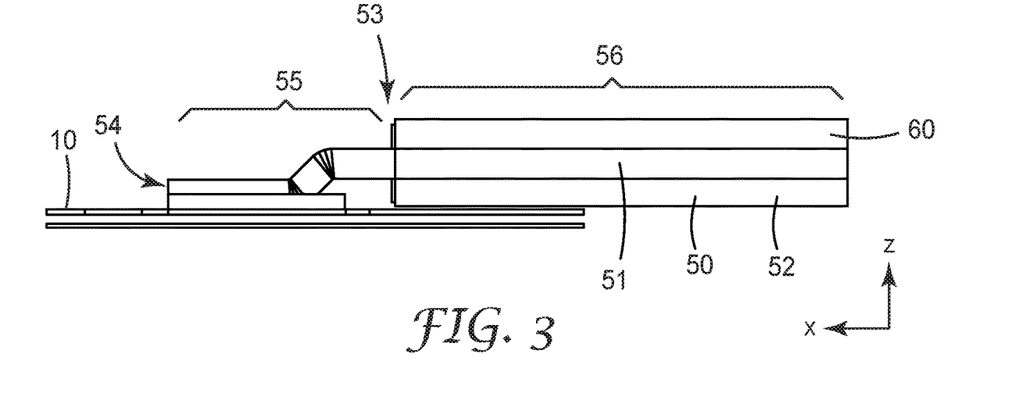
FIG. 3 is side elevation view of a PCB and differential pairs, also showing stripped sections and unstripped sections, according to exemplary embodiments of the present disclosure.

Turning to the figures, FIG. 1 is an upper perspective view of a Printed Circuit Board (PCB) 10 and differential pairs 40, FIG. 2 is an upper perspective view of a PCB 10 and differential pairs 40, similar to those of FIG. 1, and FIG. 3 is an upper perspective view of a PCB 10 and differential pairs 40, also showing stripped sections 55 and unstripped sections 56, according to exemplary embodiments of the present disclosure. As can be seen in the figures, an X axis can be orthogonal to a Y axis, and each of the X axis and the Y axis can be orthogonal to a Z axis. For clarity, moving upwardly along the Z axis can indicate moving upward vertically in FIG. 1 as indicated by the arrowhead, while moving downwardly along the Z axis can indicate the opposite direction. Moving from the upper right to the lower left along the PCB 10 or cable 60 in FIG. 1 can indicate moving forwardly along the X axis as indicated by the arrowhead, whereas moving in the opposite direction can indicate moving rearwardly along the X axis. Finally, moving from the upper left towards the lower right in FIG. 1 can indicate moving forwardly along the Y axis as indicated by the arrowhead, whereas moving in the opposite direction can indicate 30 moving rearwardly along the Y axis.

A Printed Circuit Board (PCB) 10 can include a plurality of alternating ground pads 20 and groups 30 of signal pads 31. The PCB 10 can include a non-conductive, or substantially non-conductive, substrate as is commonly known to those skilled in the art, and the ground pads 20 and/or signal pads 31 can be affixed to the PCB 10.

A cable 60 can include a plurality of spaced apart differential pairs 40 extending along a length (x-axis) of the cable 60 and the differential pairs 40 can be arranged along a width (y-axis) of the cable 60. One, more than one, or each differential pair 40 can be surrounded by one or more electrically conductive layers 41, 42 and can further include a plurality of insulated conductors 50. Each insulated conductor 50 can include a conductor 51 surrounded by an insulating material 52. As can be exemplarily seen in FIG. 3, The insulating material 52 can be stripped between an insulation-end location 53 on the insulated conductor 50 and a free end 54 of the insulated conductor 50 to form a stripped section 55 next to an unstripped section 56. The stripped sections 55 of the insulated conductors 50 of each differential pair 40 can terminate at corresponding signal pads 31 of a corresponding group 30 of signal pads 31 of the PCB 10. Each of the ground pads 20, signal pads 31, and/or conductors 51 can include an electrically conductive material known to those skilled in the art including, but not limited to, metals, metal alloys, copper, silver, gold, aluminum, graphite, conductive polymers, conductive non-metals, soldering, weldments, or steel. Additionally, the insulating material 52 can include electrically insulating, or substantially electrically insulating material, known to those skilled in the art including, but not limited to, polymers, organic materials, plastics, electrical tape, adhesives, ceramics, glass, fiberglass, rubbers, and thermoplastics.

Figure 4:
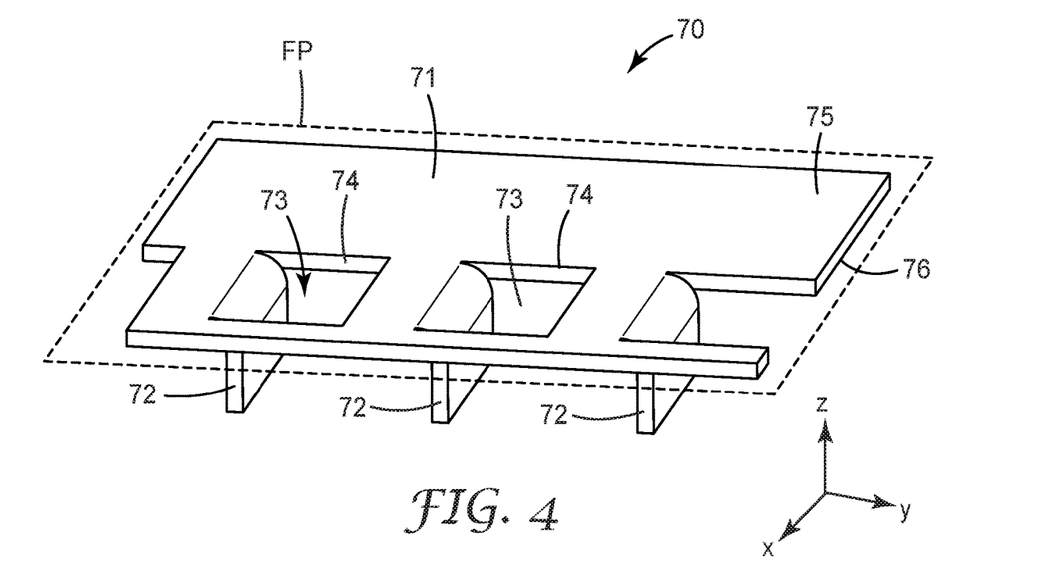
FIG. 4 is an upper perspective view of an electrically conductive shield, according to exemplary embodiments of the present disclosure.
Figure 5:
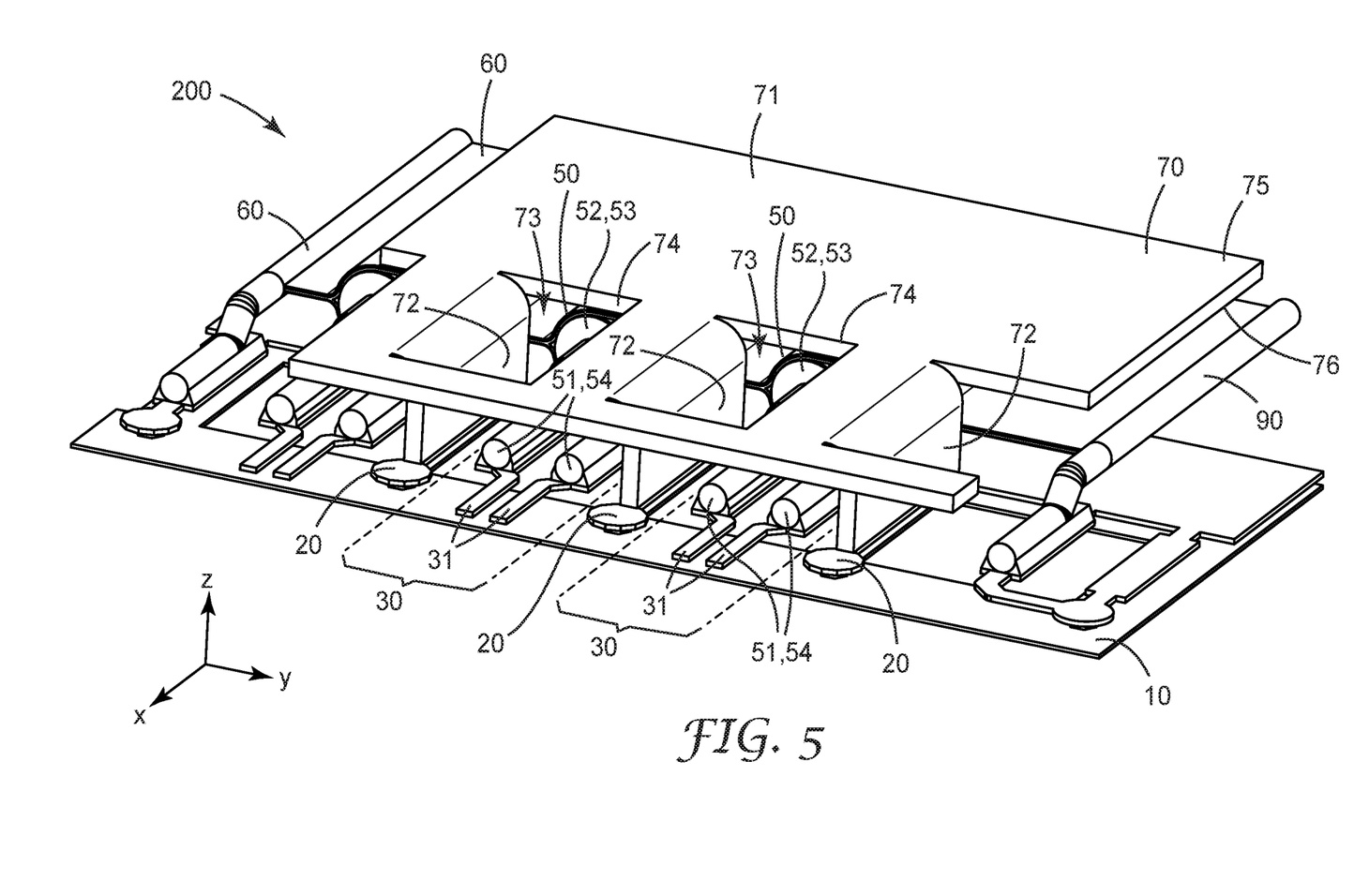
FIG. 5 is an upper perspective view of a cable assembly, according to exemplary embodiments of the present disclosure.

FIG. 4 is an upper perspective view of an electrically conductive shield 70 and FIG. 5 is an upper perspective view of a cable assembly 200, according to exemplary embodiments of the present disclosure. The electrically conductive shield 70 can include a cover portion 71 disposed on and/or covering at least a portion of the unstripped sections 56 of the insulated conductors 50. The electrically conductive shield 70 can further include a plurality of spaced apart walls 72, and one, more than one, or each wall 72 can be disposed between the stripped sections 55 of the insulated conductors 50 of two adjacent differential pairs 40. In some embodiments, one, more than one, or each of the spaced apart walls 72 can extend from the cover portion 71 to, and can make electrical contact with, a corresponding ground pad 20 disposed between the groups 30 of signal pads 31 corresponding to the adjacent differential pairs 40.

In various embodiments, one, more than one, or each wall 72 can be separate elements from each other and/or from the cover portion 71. In some embodiments, one, more than one, or each wall 72 can be adjacent, joined with, and/or connected to the cover portion 71. Further, the walls 72 and the cover portion 71 can be unitary, formed from a single piece, can be comprised of connected elements or of rigidly connected elements, or can otherwise define the electrically conductive shield 70 as an electrically conductive unitary shield. The walls 72 can be, or can be substantially, perpendicular to the Y axis and the cover portion 71 can be, or can be substantially, perpendicular to the Z axis.

In some embodiments, the shield 70 can further define a plurality of openings 73 alternately arranged with the plurality of walls 72. One, one or more, or each opening 73 can expose the stripped sections 55 of the insulated conductors 50 of a corresponding differential pair 40. One, one or more, or each opening 73 can also be disposed perpendicularly, or substantially perpendicularly, to the Z axis, such that the Z axis can pass through the opening 73. In some embodiments, the walls 72 and openings 73 can be formed by mechanically bending a portion of the cover portion 71. A given wall 72 can be formed by cutting, stamping, or chemically forming a section of the cover portion 71 while leaving the cover portion 71 attached to the section, and then bending the section such that the section is not co-planar with the cover portion 71. As exemplarily shown in FIG. 4, the walls 72 can be formed by bending the section 72 'downward' such that the wall 72 is perpendicular to, or substantially perpendicular to, the Y axis. Further, FIG. 5 shows the walls 72 and the cover portion 71 extending forwardly along the X axis to the same extent, and also shows the walls 72 not extending farther forwardly along the X-axis than the cover portion 71. Each of the electrically conductive shield 70, cover portion 71, and/or walls 72 can include an electrically conductive material known to those skilled in the art including, but not limited to, metals, metal alloys, copper, silver, gold, aluminum, graphite, conductive polymers, conductive non-metals, soldering, weldments, or steel.

Figure 6:
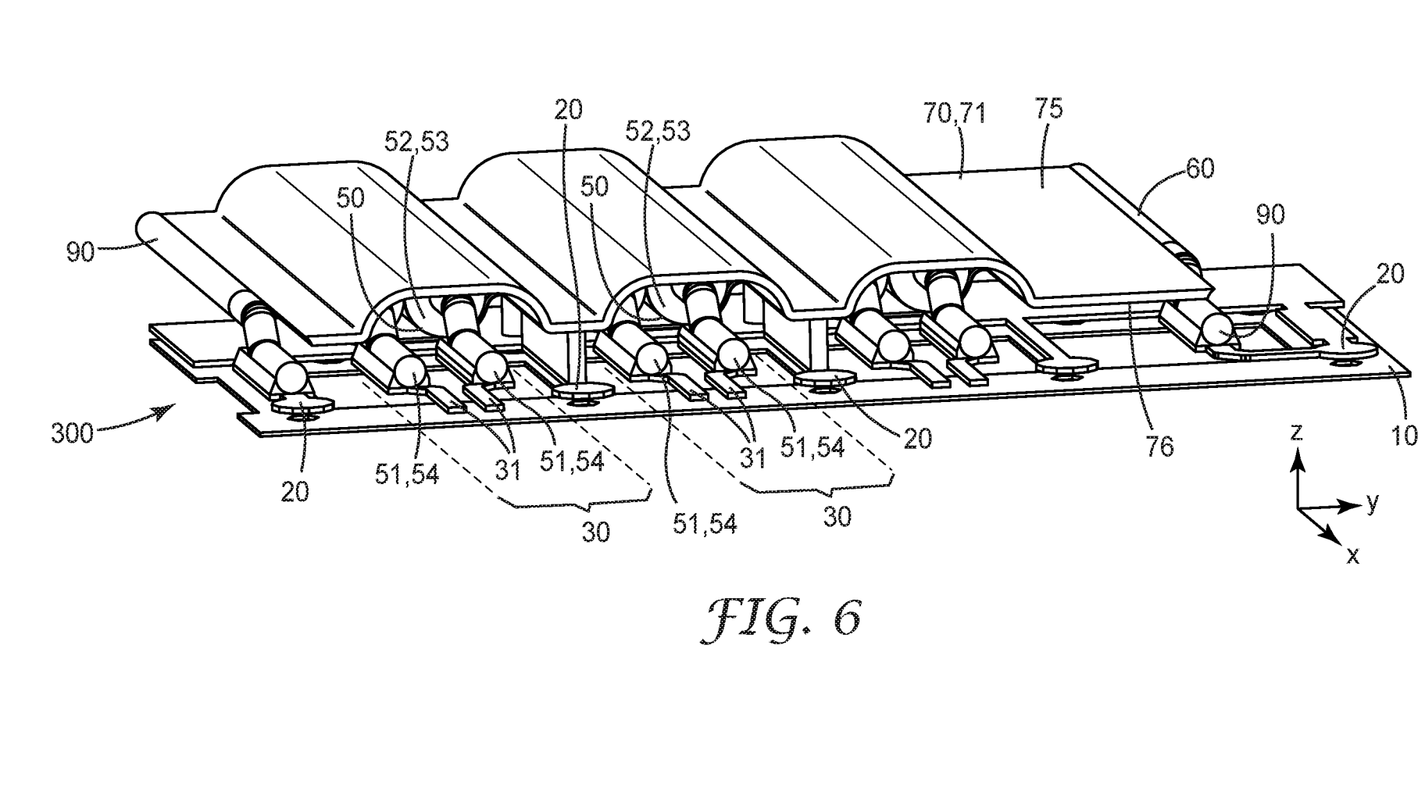
FIG. 6 is an upper perspective view of another embodiment of a cable assembly, according to exemplary embodiments of the present disclosure.

FIG. 6 is an upper perspective view of another embodiment of a cable assembly 300, according to exemplary embodiments of the present disclosure. FIG. 6 illustrates a cover portion 71 without openings 73. In the embodiment of FIG. 6, the walls 72 and cover portion 71 can extend forwardly along the X-axis to the same extent. The shield 70 and/or cover portion 71 can also cover (or be located forwardly of or above, as measured along the Z-axis) the stripped sections 55 of the insulated conductors 50 and/or the unstripped sections 56 of the insulated conductors 50, and/or can extend farther forwardly than the insulation-end location 53 as measured along the X axis. Further, the walls 72 and cover portion 71 can define a unitary structure or a unitary electrically conductive shield 70 made from a single element, or can be joined by any conventional means in the art such as, but not limited to, adhesives, mechanical fasteners, interference fits, weldments, and soldering.

Figure 7:
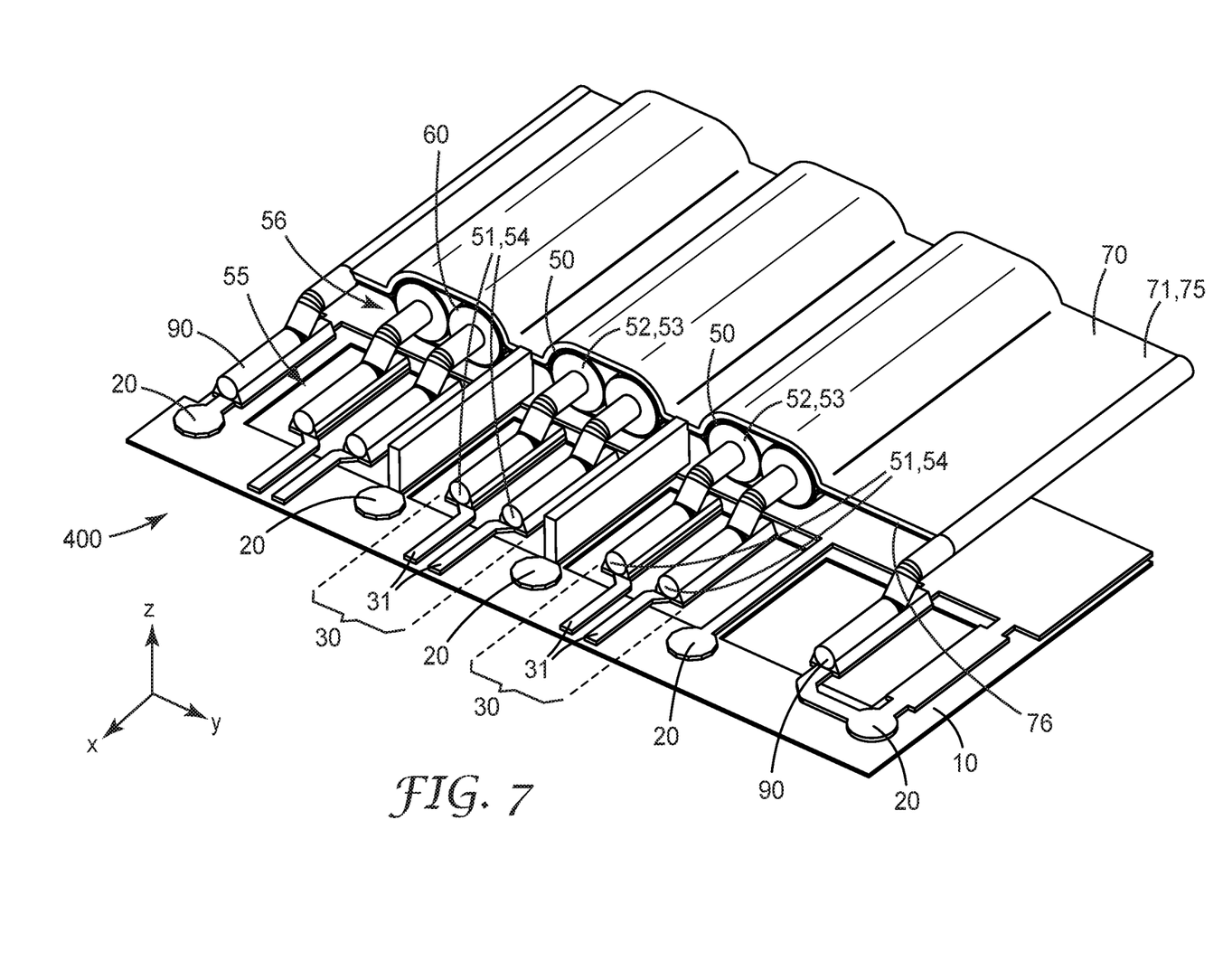
FIG. 7 is an upper perspective view of another embodiment of a cable assembly, according to exemplary embodiments of the present disclosure.

FIG. 7 is an upper perspective view of another embodiment of a cable assembly 400, according to exemplary embodiments of the present disclosure. FIG. 7 illustrates a cover portion 71 without openings 73. In the embodiment of FIG. 7, the walls 72 and cover portion 71 can extend forwardly along the X-axis to different extents, and at least one wall (or each wall) 72 can extend farther forwardly along the X-axis than does the cover portion 71. The shield 70 and/or cover portion 71 can also cover (or be located forwardly of or above, as measured along the Z-axis) the unstripped sections 56 of the insulated conductors 50 but not the stripped sections 55 of the insulated conductors 50, and/or can extend to the same extent as the insulation-end location 53 as measured along the X axis. Further, the walls 72 and cover portion 71 can define a unitary structure or a unitary electrically conductive shield 70 made from a single element, or can be joined by any conventional means in the art such as, but not limited to, adhesives, mechanical fasteners, interference fits, weldments, and soldering.

In various embodiments, one wall 72, at least one wall 27, or each wall 72 makes physical contact with, is soldered to, is welded to, is inserted into, is bonded to, and/or is surface mounted to a corresponding ground pad 20.

In some embodiments, an electrically conductive unitary shield 70 for reducing crosstalk between adjacent differential pairs 40 of a cable 60, includes a cover portion 71 generally lying in a first plane FP, or an XY plane, and a row of alternating walls 72 and through-openings 73. One wall, 72, at least one wall 72, or each wall 72 can be oriented substantially perpendicularly, or perpendicularly, to the first plane FP. As can be exemplarily seen in FIG. 4, among others, one through opening 73, at least one through opening 73, or each through opening 73 can include a closed circumference 74 and/or can extend between a first major surface 75 and an opposing second major surface 76 of the unitary shield 70. When stripped ends 55 of insulated conductors 50 of a differential pair 40 of a cable 60, the differential pair 40 substantially surrounded by an electrically conductive first shield 41, 42, are terminated at conductive signal pads 31 of a printed circuit board 10, the signal pads 31 disposed between opposing conducting ground pads 20, and the unitary shield 70 is assembled to the cable 60 and the substrate (the PCB 10 can also be called the substrate), the cover portion 71 of the unitary shield 70 can closely cover the cable 60 so as to capacitively couple to the first shield 41, 42 of the differential pair 40. Further, a pair of adjacent walls 72 can make physical and/or electrical contact with the opposing ground pads 20 so that the terminated stripped ends 55 of the insulated conductors 50 are exposed through the through-opening 73 disposed between the pair of adjacent walls 72.

Figure 8:
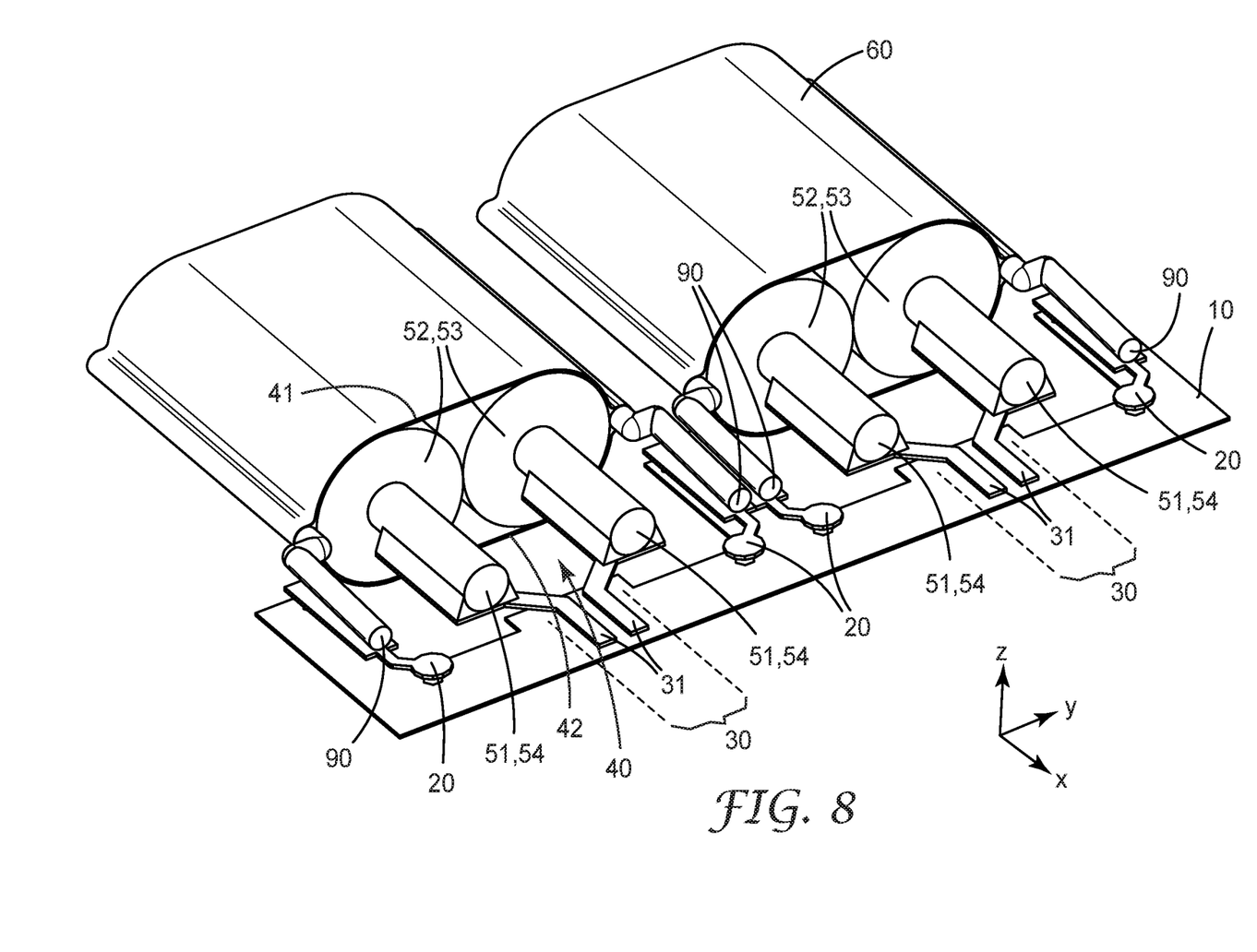
FIG. 8 is an upper perspective view of a PCB, differential pairs, and drain wires, according to exemplary embodiments of the present disclosure.
Figure 9:
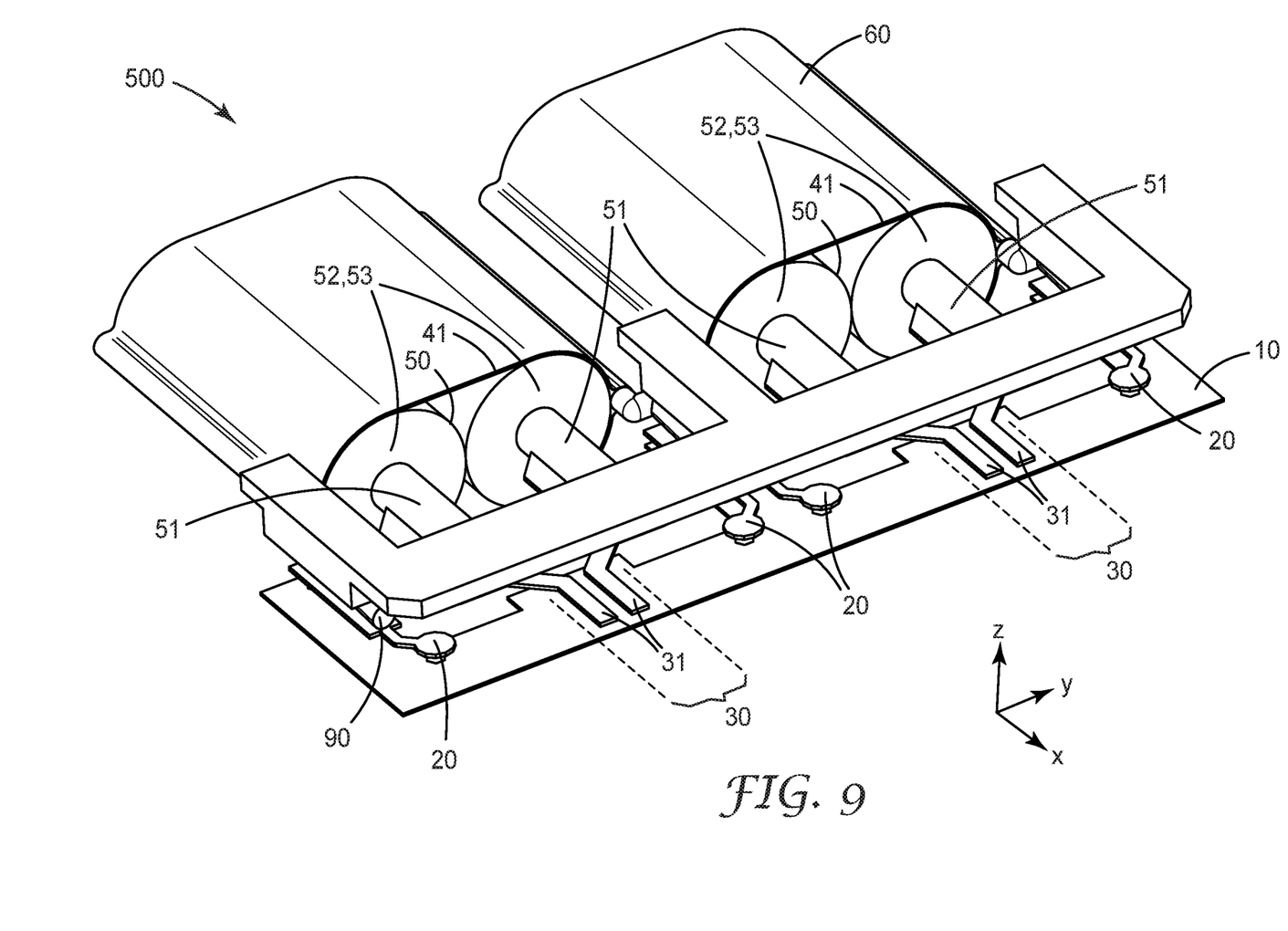
FIG. 9 is an upper perspective view of another embodiment of a cable assembly, according to exemplary embodiments of the present disclosure.

FIG. 8 is an upper perspective view of a PCB 10, differential pairs 40, and drain wires 90, and FIG. 9 is an upper perspective view of another embodiment of a cable assembly 500, according to exemplary embodiments of the present disclosure. In some embodiments, the cable assembly 500 includes the PCB 10 comprising a plurality of alternating ground pads 20 and groups 30 of signal pads 31. The cable assembly 500 can also include a cable 60 with a plurality of spaced apart differential pairs 40 extending along a length (X-axis) of the cable 60 and arranged along a width (Y-axis) of the cable 60. Each differential pair 40 can be surrounded by one or more electrically conductive layers 41, 42 and can include a plurality of insulated conductors 50. One, more than one, or each insulated conductor 50 can include a conductor 51 surrounded by an insulating material 52. One, more than one, or each of the insulating material 52 can be stripped between an insulation-end location 53 on the insulated conductor 50 and a free end 54 of the insulated conductor 50 to form a stripped section 55 next to an unstripped section 56. The stripped sections 55 of the insulated conductors 50 of each differential pair 40 can terminate at corresponding signal pads 31 of a corresponding group 30 of signal pads 31 of the PCB 10.

As can be seen in FIGS. 8 and 9, one, more than one, or a plurality of drain wires 90 can extend along the X-axis. The drain wires 90 can make electrical contact with a corresponding ground pad 20. The cable assembly 500 can further include an electrically conductive shield 70 which can define a cover portion 71 disposed above at least a portion of the printed circuit board 10 as measured along a Z-axis and one, more than one, or a plurality of spaced apart walls 72. Each wall 72 can be disposed between the stripped sections 55 of the insulated conductors 50 of two adjacent differential pairs 40 and can extend from the cover portion 71 to, and can make electrical contact with and/or contact, a corresponding drain wire 90 disposed between the groups 31 of signal pads 30 corresponding to the adjacent differential pairs 40. The drain wires 90 can include an electrically conductive material known to those skilled in the art including, but not limited to, metals, metal alloys, copper, silver, gold, aluminum, graphite, conductive polymers, and conductive non-metals.

It is to be understood that elements of any of the cable assemblies 200, 300, 400, 500 with the same names, reference numerals, and/or descriptions as elements of others of the cable assemblies 200, 300, 400, 500 can have identical or similar functions, arrangements, materials, and/or features.

In some embodiments, the cover portion 71 is disposed above at least some of the signal pads 31 as measured along the Z-axis. In some embodiments, the cover portion 71 is disposed above at least some of the ground pads as measured along the Z-axis. In some embodiments, the electrically conductive shield 70 is an electrically conductive unitary shield wherein the walls 72 and the cover portion 71 can be unitary, formed from a single piece, can be comprised of connected elements or of rigidly connected elements, or can otherwise define the electrically conductive shield 70 as an electrically conductive unitary shield.

In some embodiments, as can be exemplarily seen in FIG. 9, portions of the electrically conductive shield 70 between the spaced apart walls 72 are disposed forwardly of the spaced apart walls 72, as measured along the X-axis.

In various embodiments, and as exemplarily shown in FIG. 9, portions of the electrically conductive shield 70 between the spaced apart walls 72 are disposed forwardly of the insulation-end location 53, as measured along the X-axis. In some embodiments, portions of the electrically conductive shield 70 between the spaced apart walls 72 are disposed forwardly of the stripped section 55, as measured along the X-axis, and each drain wire 90 makes physical contact with a corresponding ground pad 20 in various embodiments.

In some embodiments, one drain wire 90, at least one drain wire 90, or each drain wire 90 makes physical contact with, is soldered to, is welded to, is inserted into, is bonded to, and/or is surface mounted to a corresponding ground pad 20. Further, in various embodiments, one drain wire 90, at least one drain wire 90, or each drain wire 90 makes physical contact with, is soldered to, is welded to, is inserted into, and/or is bonded with an adhesive to a corresponding wall 72.

Figure 10:
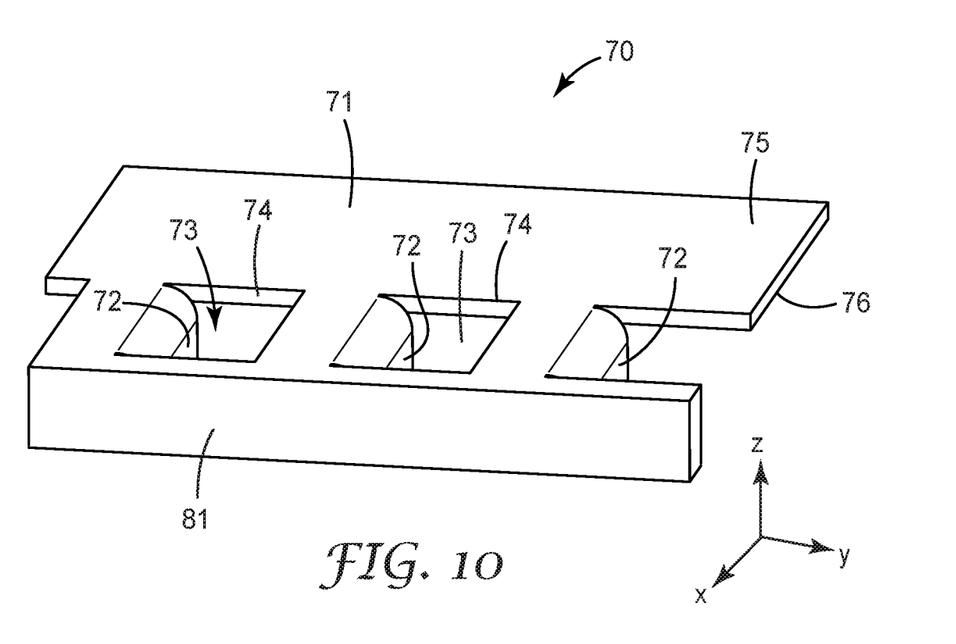
FIG. 10 is an upper perspective view of another embodiment of an electrically conductive shield, according to exemplary embodiments of the present disclosure.

FIG. 10 is an upper perspective view of another embodiment of an electrically conductive shield 70, according to exemplary embodiments of the present disclosure. In the exemplary embodiment of FIG. 10, a front wall 81 is disposed perpendicularly, or substantially perpendicularly, to the cover portion 71, first major surface 75, second major surface 76, and/or the electrically conductive shield 70. The shield 70 can be formed by joining an element (81) to the embodiment shown in FIG. 4 or can be formed by bending a front portion of the shield 70 and/or cover portion 71 (as measured along the X axis) 'downward', or from being perpendicular to the Z axis to being perpendicular to the X axis. The front wall 81 can be disposed, as measured along the X-axis, forward of the conductors 51 and/or free ends 54. In some embodiments, the front wall 81 is in contact with one or more of the conductors 51 and/or one or more of the free ends 54. The front wall 81 can also be disposed above (as measured along the Z axis) one or more of the signal pads 31 and/or above one or more of the groups 30 of signal pads 31. In various embodiments, the front wall 81 can be in contact with, adjacent, joined to, bonded with, inserted into, surface mounted to, and/or welded to one or more of the signal pads 31. It is to be understood that the shield 70 embodiment shown in FIG. 10 can be used in place of any other shield embodiment 70 shown or disclosed throughout this disclosure. The disclosed embodiment of FIG. 10 can create a cable assembly 200, 300, 400, 500 where signal pads 31 and/or groups 30 of signal pads 31 are surrounded on three sides, on a forward (as measured along the X axis) side by the front wall 81 and on lateral sides (as measured along the Y axis) by sequential walls 72. Such an embodiment can be useful in reducing or preventing the wicking or spreading of adhesives, such as that used to join various elements together including, but not limited to, conductors 51 and signal pads 31, to undesirable areas such as other portions of the signal pads 31, groups 30 of signal pads 31, PCB 10, ground pads 20, or other areas forward (as measured along the X axis) of the front wall 81, free end 54, stripped section 55, insulation-end location 53 and/or unstripped section 56. It is also to be understood that the front wall 81 can be joined to and/or connected to a front end of one or more walls 72 as measured along the X axis.

The terms and expressions that have been employed are used as terms of description and not of limitation, and there is no intention in the use of such terms and expressions of excluding any equivalents of the features shown and described or portions thereof, but it is recognized that various modifications are possible within the scope of the embodiments of the present disclosure. Thus, it should be understood that although the present disclosure has been specifically disclosed by specific embodiments and optional features, modification and variation of the concepts herein disclosed may be resorted to by those of ordinary skill in the art, and that such modifications and variations are considered to be within the scope of embodiments of the present disclosure. The complete disclosures of the patents, patent documents, and publications cited herein are incorporated by reference in their entirety as if each were individually incorporated. To the extent that there is any conflict or discrepancy between this specification as written and the disclosure in any document that is incorporated by reference herein, this specification as written will control.

What is claimed is:

1. A cable assembly, comprising:
a printed circuit board (PCB) comprising a plurality of alternating ground pads and groups of signal pads;
a cable comprising a plurality of spaced apart differential pairs extending along a length (x-axis) of the cable and arranged along a width (y-axis) of the cable, each differential pair surrounded by one or more electrically conductive layers and comprising a plurality of insulated conductors, each insulated conductor comprising a conductor surrounded by an insulating material, the insulating material stripped between an insulation-end location on the insulated conductor and a free end of the insulated conductor to form a stripped section next to an unstripped section, the stripped sections of the insulated conductors of each differential pair terminating at corresponding signal pads of a corresponding group of signal pads of the PCB; and
an electrically conductive shield comprising:
a cover portion disposed on and covering at least a portion of the unstripped sections of the insulated conductors; and
a plurality of spaced apart walls, each wall disposed between the stripped sections of the insulated conductors of two adjacent differential pairs and extending from the cover portion to, and making electrical contact with, a corresponding ground pad disposed between the groups of signal pads corresponding to the adjacent differential pairs.

2. The cable assembly of claim 1, wherein the shield further defines a plurality of openings alternately arranged with the plurality of walls, each opening exposing the stripped sections of the insulated conductors of a corresponding differential pair.

3. The cable assembly of claim 1, wherein the electrically conductive shield is an electrically conductive unitary shield.

4. The cable assembly of claim 1, wherein each spaced apart wall extends forwardly from the electrically conductive shield along the X axis.

5. The cable assembly of claim 1, wherein each wall makes physical contact with the corresponding ground pad.

6. The cable assembly of claim 1, wherein each wall is soldered to the corresponding ground pad.

7. The cable assembly of claim 1, wherein each wall is welded to the corresponding ground pad.

8. The cable assembly of claim 1, wherein each wall is inserted into the corresponding ground pad.

9. The cable assembly of claim 1, wherein each wall is bonded to the corresponding ground pad with an adhesive.

10. The cable assembly of claim 1, wherein each wall is surface mounted to the corresponding ground pad.

11. An electrically conductive unitary shield for reducing crosstalk between adjacent differential pairs of a cable, the conductive unitary shield comprising:
a cover portion generally lying in a first plane (xy-plane); and
a row of alternating walls and through-openings, each wall oriented substantially perpendicular (xz-plane) to the first plane, each through opening comprising a closed circumference and extending between opposing first and second major surfaces of the unitary shield, such that when stripped ends of insulated conductors of a differential pair of a cable, the differential pair substantially surrounded by an electrically conductive first shield, are terminated at conductive signal pads of a printed circuit board, the signal pads disposed between opposing conducting ground pads, and the unitary shield is assembled to the cable and the substrate, the cover portion of the unitary shield closely covers the cable so as to capacitively couple to the first shield of the differential pair, and a pair of adjacent walls make physical and electrical contact with the opposing ground pads so that the terminated stripped ends of the insulated conductors are exposed through the through-opening disposed between the pair of adjacent walls.

12. A cable assembly, comprising:
a printed circuit board (PCB) comprising a plurality of alternating ground pads and groups of signal pads;
a cable comprising a plurality of spaced apart differential pairs extending along a length (x-axis) of the cable and arranged along a width (y-axis) of the cable, each differential pair surrounded by one or more electrically conductive layers and comprising a plurality of insulated conductors, each insulated conductor comprising a conductor surrounded by an insulating material, the insulating material stripped between an insulation-end location on the insulated conductor and a free end of the insulated conductor to form a stripped section next to an unstripped section, the stripped sections of the insulated conductors of each differential pair terminated at corresponding signal pads of a corresponding group of signal pads of the PCB;

a plurality of drain wires extending along the X-axis, each drain wire making electrical contact with a corresponding ground pad; and an electrically conductive shield comprising:
 a cover portion disposed above at least a portion of the printed circuit board as measured along a Z-axis; and
 a plurality of spaced apart walls, each wall disposed between the stripped sections of the insulated conductors of two adjacent differential pairs and extending from the cover portion to, and making electrical contact with, a corresponding drain wire disposed between the groups of signal pads corresponding to the adjacent differential pairs.

13. The cable assembly of claim 12, wherein the cover portion is disposed above at least some of the signal pads as measured along the Z-axis.

14. The cable assembly of claim 12, wherein the cover portion is disposed above at least some of the ground pads as measured along the Z-axis.

15. The cable assembly of claim 12, wherein the electrically conductive shield is an electrically conductive unitary shield.

16. The cable assembly of claim 12, wherein portions of the electrically conductive shield between the spaced apart walls are disposed forwardly of the spaced apart walls, as measured along the X-axis.

17. The cable assembly of claim 12, wherein portions of the electrically conductive shield between the spaced apart walls are disposed forwardly of the insulation-end location, as measured along the X-axis.

18. The cable assembly of claim 12, wherein portions of the electrically conductive shield between the spaced apart walls are disposed forwardly of the stripped section, as measured along the X-axis.

19. The cable assembly of claim 12, wherein each drain wire makes physical contact with the corresponding ground pad.

20. The cable assembly of claim 12, wherein each drain wire is soldered to the corresponding ground pad.

21. The cable assembly of claim 12, wherein each drain wire is welded to the corresponding wall.

22. The cable assembly of claim 12, wherein each drain wire is inserted into the corresponding wall.

23. The cable assembly of claim 12, wherein each drain wire is bonded to the corresponding wall with an adhesive.

* * * * *